United States Patent [19]

Katayama et al.

[11] Patent Number: 5,416,371

[45] Date of Patent: May 16, 1995

[54] SENSE SYSTEM FOR DYNAMIC RANDOM ACCESS MEMORY

[75] Inventors: Yasunao Katayama, Sagamihara; Toshiaki Kirihata, Matsudo, both of Japan; Roy L. Scheuerlein, Sunnyvale, Calif.

[73] Assignee: International Business Machines Corporation, Armonk, N.Y.

[21] Appl. No.: 734,416

[22] Filed: Jul. 23, 1991

[30] Foreign Application Priority Data

Aug. 8, 1990 [JP] Japan .................................. 2-208316

[51] Int. Cl.6 ........................ G11C 7/00; G11C 11/00; H03K 5/24
[52] U.S. Cl. .................................. 327/57; 365/189.05; 365/203; 365/205; 365/208
[58] Field of Search ............... 365/189.05, 189.06, 365/203–205, 208; 307/530

[56] References Cited

U.S. PATENT DOCUMENTS

| | | | |
|---|---|---|---|
| 4,368,529 | 1/1983 | Furuyama | 365/208 X |
| 4,475,178 | 10/1984 | Kinoshita | 365/203 |
| 4,508,980 | 4/1985 | Puar | 307/530 |
| 4,688,063 | 8/1987 | Lu et al. | 257/304 |
| 4,780,850 | 10/1988 | Miyamoto et al. | 365/203 X |
| 4,816,706 | 3/1989 | Dhong et al. | 307/530 |
| 4,910,711 | 3/1990 | Guo | 365/189.06 |
| 4,924,442 | 5/1990 | Chen et al. | 365/189.06 X |
| 5,029,137 | 7/1991 | Hoshi | 365/208 |
| 5,091,885 | 2/1992 | Ohsawa | 365/205 X |

FOREIGN PATENT DOCUMENTS

| | | | |
|---|---|---|---|
| 62-165676 | 7/1987 | Japan | G11C 11/34 |
| 63-197093 | 8/1988 | Japan | G11C 11/34 |
| 64-72395 | 3/1989 | Japan | G11C 11/34 |

OTHER PUBLICATIONS

S. Dhong et al., "High-Speed Sensing Scheme for CMOS DRAM's, " IEEE Journal of Solid-State Circuits, vol. 23, No. 1, Feb. 1988, pp. 34–40.

T. Kirihata et al., "A Pulsed Sensing Scheme with a Limited Bit Line Swing," IBM Research, Tokyo Research Lab., IBM Japan pp. 63–64.

T. Kirihata et al., "A 15-ns Experimental DRAM with a Limited-Bit-Line-Swing Sense Amplifier," IBM Research, Toyko Research Lab., IBM Japan, Ltd.

*Primary Examiner*—Benny Lee
*Attorney, Agent, or Firm*—Mark F. Chadurjian; James M. Leas

[57] ABSTRACT

A dynamic random access memory (DRAM) of 2/3 VDD precharge scheme is disclosed. A latch driving circuit controls the voltage of the common node of a sense latch so as to limit the downward voltage swing of bitlines to 1/3 VDD, a low level restore voltage. The sense latch is coupled to a pair of I/O data lines through PMOS FET column switches. This invention provides high speed memory operation and reduces power consumption.

17 Claims, 3 Drawing Sheets

SENSE SYSTEM FOR DYNAMIC RANDOM ACCESS MEMORY

BACKGROUND OF THE INVENTION

1. Technical Field

The present invention relates to a semiconductor memory and more particularly pertains to a sense system for a random access memory (RAM).

2. Background Art

CMOS technology has been applied to DRAM architectures in an effort to enhance memory density while reducing power. In addition, various memory circuit designs have been proposed to improve operation speed and reliability. An example of such a design is the so-called 2/3 VDD bitline precharge sensing scheme disclosed in U.S. Pat. No. 4,816,706 (Japanese Published Unexamined Patent Application (Patent Kokai) No. 64-72395) by S. H. Dhong et al.

With reference to FIG. 4 (Prior Art) the memory circuit of the above-mentioned U.S. patent has a memory sense amplifier circuit comprised of a first latch consisting of cross-coupled N-channel MOS FETs (NMOS FET) 18 and 20 and a second latch consisting of cross-coupled P-channel MOS FETs (PMOS FET) 14 and 16.

A common node 38 of the first latch is connected to ground through an NMOS FET 24 which is controlled by a latching clock $\phi s$. A common node 36 of the second latch is connected to a power supply voltage VDD through a PMOS FET 22 which is controlled by another latching clock $\phi sp$. The first and second latch circuits are connected through PMOS FETs 10 and 12 whose gates are grounded. Between bitlines 26 and 28, an equalizing device consisting of a PMOS FET 30 is connected.

At the memory sensing time, the sense amplifier circuit is activated by the latching clocks $\phi s$ and $\phi sp$, thereby amplifying the potential difference between the bitlines 26 and 28. The voltage of a lower level bitline is pulled down by the first latch, but the downward swing of the bitline voltage is clamped at the absolute value of the threshold voltage (VTP) of the grounded-gate PMOS coupling FETs 10 and 12. The precharging of the bitlines after the sensing operation is made by equalizing the voltages of the bitlines 26 and 28 by means of the PMOS FET 30 ($\phi_{eq}$). After the sensing operation, the higher level bitline is pulled up from the precharge level to VDD by the second latch, while the lower level bitline remains at the voltage level of VTP. Accordingly, by equalization, the bitlines 26 and 28 are precharged to (VDD+VTP)/2, normally being at 2/3 VDD.

The memory circuit of this patent has the advantage of achieving high speed sensing, while saving power by limiting the voltage swing of the bitlines within a voltage range of (VDD-VTP). A further advantage is that because the downward swing of the bitline voltage is clamped at VTP, the bitline voltage swing is symmetrical relative to the precharge level, even when a 2/3 VDD bitline precharge scheme is used, thereby improving noise immunity. The sensing scheme using the 2/3 VDD bitline precharge system is also described in an article by S. H. Dhong et al. "High-Speed Sensing Scheme for CMOS DRAM'S", IEEE Journal of Solid-State Circuits, Vol. 23, pp. 34-40, Feb., 1988.

However, the PMOS FETs 10 and 12 of the memory circuit of this patent operate in a source-follower mode, thus giving high resistances at low voltages that result in reducing the bitline discharge speed. This results in reducing the access speed (i.e. the speed at which write and restore operations can be carried out). Accordingly, in the 2/3 VDD precharge system, it is desirable to limit the downward voltage swing of the bitlines without reducing memory speed. Furthermore, in order to achieve a high performance DRAM, it is desirable to carry out high speed transfers between the sense amplifier circuit and the I/O dataline. These requirements need to be met with low power consumption and without impairing reliability.

Other technical literature considered to have some relevance to this invention is as follows:

Japanese Published Unexamined Patent Application (Patent Kokai) No.62-165787 discloses a DRAM having a restore circuit and a sense amplifier coupled through barrier FETs for load capacitance isolation. The restore circuit is composed of a latch consisting of PMOS FETs which are cross-coupled, with the cross-coupled nodes connected to a pair of bitlines. The sense amplifier is composed of a latch consisting of NMOS FETs which are cross-coupled. The cross-coupled nodes of the restore circuit and those of the sense amplifier are coupled through barrier transistors consisting of NMOS FETs. To the gate of each barrier FET, a constant voltage that is larger than the summation of the bitline precharge voltage and the threshold voltage of the barrier FET is applied. However, this prior art does not disclose limiting the downward voltage swing of the bitlines by controlling the voltage of the common node of the sense latch and coupling the sense latch to I/O data lines through PMOS FET gates, as in the present invention.

Japanese Published Unexamined Patent Application (Patent Kokai) No. 63-197093 discloses a DRAM having a first sense amplifier consisting of cross-coupled NMOS FETs and a second sense amplifier consisting of cross-coupled PMOS-FETs. The cross-coupled nodes of the first sense amplifier are directly connected with the cross-coupled nodes of the second sense amplifier and are also connected with a pair of bitlines. A precharge voltage generating circuit is connected to the common node of the first sense amplifier. Between the common node of the first sense amplifier and the pair of bitlines, a pair of NMOS FETs are connected which turn on during the precharging period; between the common node of the second sense amplifier and a pair of bitlines, a pair of PMOS FETs are connected which also turn on during the precharging period. When the pair of bitlines are equalized to 1/2 VCC (VCC is the high power supply voltage) by an equalizing FET connected between the pair of bitlines, the precharge voltage generating circuit is also turned on. The precharge voltage generating circuit generates a bitline precharge voltage VBL which is nearly equal to 1/2 VCC, said voltage being coupled to the pair of bitlines and the common node of the second sense amplifier through the pair of NMOS FETs and the pair of PMOS FETs. In this way, the pair of bitlines and the common nodes of both sense amplifiers are reliably precharged to the precharge voltage VBL which is nearly equal to 1/2 VCC. This prior art does not disclose limiting the downward voltage swing of the bitline by controlling the voltage of the common node of the sense latch and coupling the sense latch to I/O data lines through PMOS FET gates, as in the present invention.

SUMMARY OF THE INVENTION

Accordingly, an object of this invention is to provide an improved DRAM capable of achieving a high speed operation.

Another object is to provide an improved DRAM which limits downward voltage swing of bitlines by means of a novel system.

Still another object is to provide an improved high speed DRAM which is capable of achieving high speed data transfers between a sense amplifier and I/O data lines.

The foregoing and other objects of the invention are realized by a memory system comprised of a sense amplifier circuit which has a latch including a pair of cross-coupled NMOS FETs and having a pair of cross-coupled nodes and a common node, a pair of bitlines coupled to the cross-coupled nodes of the latch and precharged to a predetermined voltage before sensing and a latch driving circuit connected to the common node of the latch. The latch driving circuit couples a reference voltage to the common node of the latch for activation of the latch at the time of sensing. The latch driving circuit controls the voltage of the common node of the latch in such a way that the downward voltage swing of a lower level bitline, which is brought about by the activation of the latch, is limited to a predetermined voltage level higher than the reference voltage. This predetermined voltage level provides the restore voltage for the lower level bitline.

The downward voltage swing of the lower level bitline is limited by turning off the FET which couples the common node of the latch to the reference voltage when the bitline voltage falls to the predetermined voltage level. In this way, the predetermined bitline low voltage level may be automatically set without power consumption. Further, the bitline low voltage level may be exactly set, irrespective of fluctuations in the manufacturing process, by coupling to the common node of the latch a voltage generator which generates the predetermined bitline low voltage level.

The latch is coupled to the I/O data lines through transfer gates consisting of PMOS FETs. PMOS transfer gates prevent inversion of the state of the latch by due to noise produced by turn-on of the transfer gates. As such, these transfer gates can be turned on earlier, thereby permitting the sensed data to be transferred to the data lines at high speed.

BRIEF DESCRIPTION OF THE DRAWING

The foregoing and other structures and teachings of the present invention will become more apparent upon review of the detailed description rendered below. In the description to follow, reference will be made to the accompanying Drawing, in which.

DESCRIPTION OF THE BEST MODE FOR CARRYING OUT THE INVENTION

Figure 1:
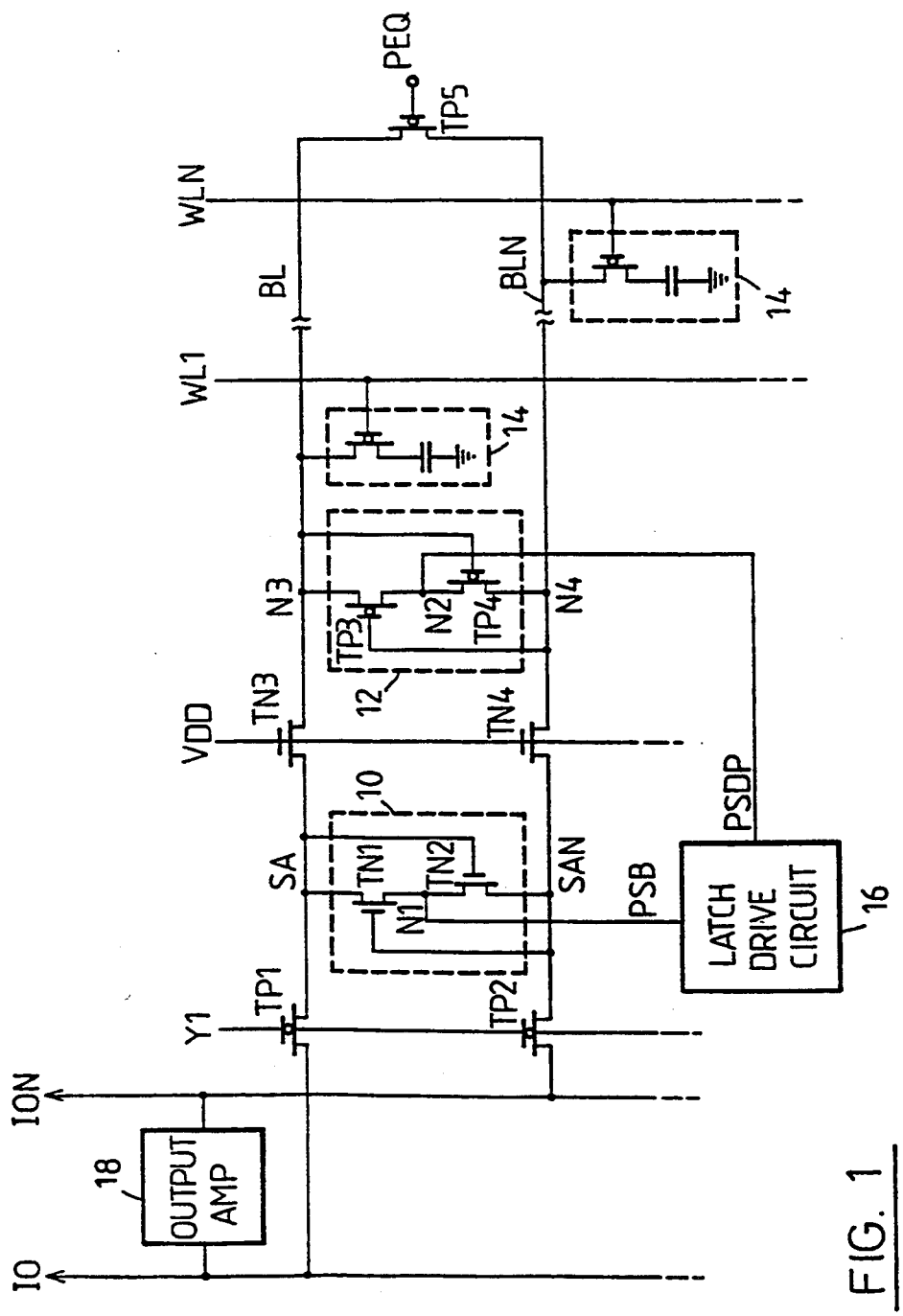
FIG. 1 is a circuit diagram showing the DRAM sense system of this invention.

FIG. 1 shows the DRAM sense system of this invention. This memory circuit comprises a first latch 10 consisting of a pair of cross-coupled NMOS FETs TN1 and TN2 and a second latch 12 consisting of a pair of cross-coupled PMOS FETs TP3 and TP4. The gates and drains of the NMOS FETs TN1 and TN2 are cross-coupled, while their sources are connected to a common node N1. The gates and drains of the PMOS FETs TP3 and TP4 are cross-coupled, while their sources are connected to a common node N2. Between the first latch 10 and the second latch 12, NMOS FETs TN3 and TN4 are connected for load capacitance isolation. To the gates of FETs TN3 and TN4, a voltage that is larger than VEQ+VTN (where VEQ denotes the bitline precharge voltage, and VTN the threshold voltage of FET TN3 or TN4) is applied. In this example, a power supply voltage VDD of 3.6V is applied. The common node N1 of the first latch 10 and the common node N2 of the second latch 12 are connected to a latch driving circuit 16. The first latch 10, the second latch 12 and the FETs TN3 and TN4 compose a memory sense amplifier circuit.

The cross-coupled nodes N3 and N4 of the second latch 12 are coupled to a pair of bitlines BL and BLN. At positions defined by the pair of bitlines BL and BLN and word lines WL1 and WLN, memory cells 14 are provided having PMOS FET switching devices. Between the pair of bitlines, a PMOS FET TP5 which responds to an equalization signal PEQ is connected.

The cross-coupled nodes SA and SAN of the first latch 10 which act as sense nodes of the sense amplifier circuit are connected to a pair of I/O data lines IO and ION through transfer gates consisting of PMOS FETs TP1 and TP2. The FETs TP1 and TP2 work as transfer gates (or "bit switches") and are controlled by a column selection signal Y1 from a column decoder. The data lines IO and ION are coupled to a conventional output amplifier circuit 18 of CMOS differential amplifier type. In FIG. 1, only one pair of bitlines are depicted. Actually, however, a large number of pairs of such bitlines are provided, and a selected pair of bitlines are selectively coupled to the data lines IO and ION through TP1, TP2.

Figure 2:
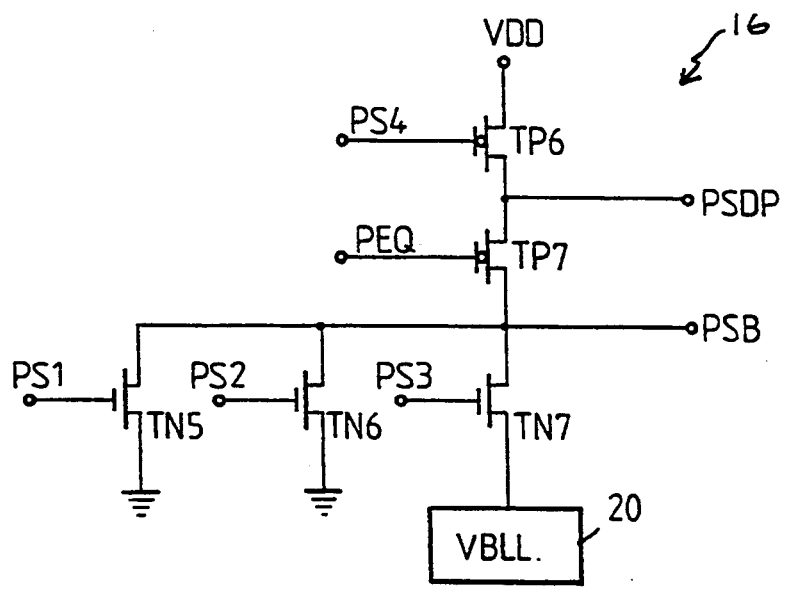
FIG. 2 is a detailed circuit diagram of the latch driving circuit of FIG. 1.
Figure 4:
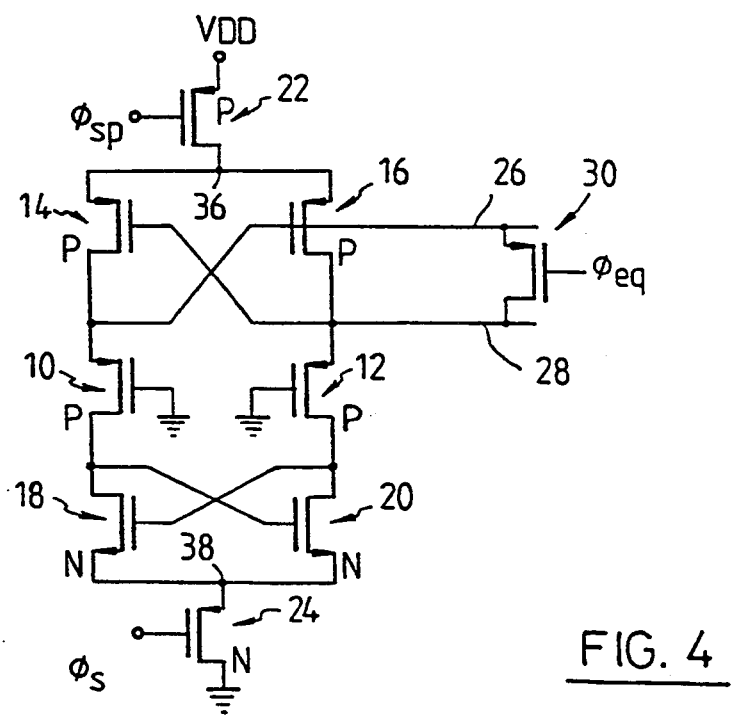
FIG. 4 (Prior Art) is a circuit diagram showing a DRAM sense system of the prior art.

FIG. 2 shows the detail of the latch driving circuit 16. The latch driving circuit has an output terminal PSB which is connected to the common node N1 of the first latch 10 (see FIG. 1) and another output terminal PSDP which is connected to the common node N2 of the second latch 12 (see FIG. 1). The driving circuit includes a small NMOS FET TN5 which receives a low speed sense activation signal PS1 during sensing period, a large NMOS FET TN6 which receives a high speed sense activation signal PS2, and an NMOS FET TN7 which receives a bitline low voltage level clamping signal PS3 during the restore period. The drains of TN5, TN6 and TN7 are commonly connected to the output terminal PSB, and the sources of TN5 and TN6 are each connected to a reference voltage selected as the ground voltage. The source of TN7 is connected to a bitline low voltage level generator VBLL 20. Between a power supply voltage VDD and the output terminal PSDP, a PMOS FET TP6 which receives a signal PS4 for activating the second latch 12 is connected, and between the output terminals PSDP and PSB, a PMOS FET TP7 which receives the equalization signal PEQ is connected.

In the following description, the operation of this system is discussed with reference to FIGS. 1, 2 and 3:

Sensing Operation

The sensing operation itself is similar to that used in conventional DRAMs which use low and high speed sensing. Before starting the sensing operation, the pair of bitlines BL and BLN and the latch nodes SA and SAN are at an equalized precharge voltage VEQ. For example, VEQ=2/3 VDD. When a selected wordline WL is brought to a low level, the associated memory cell is read out. Then, a differential voltage is generated between the pair of bitlines in correspondence with the memory value. The voltages of the bitlines are coupled to the latch nodes SA and SAN through the FETs TN3 and TN4 which are biased in a conductive state.

Figure 3:
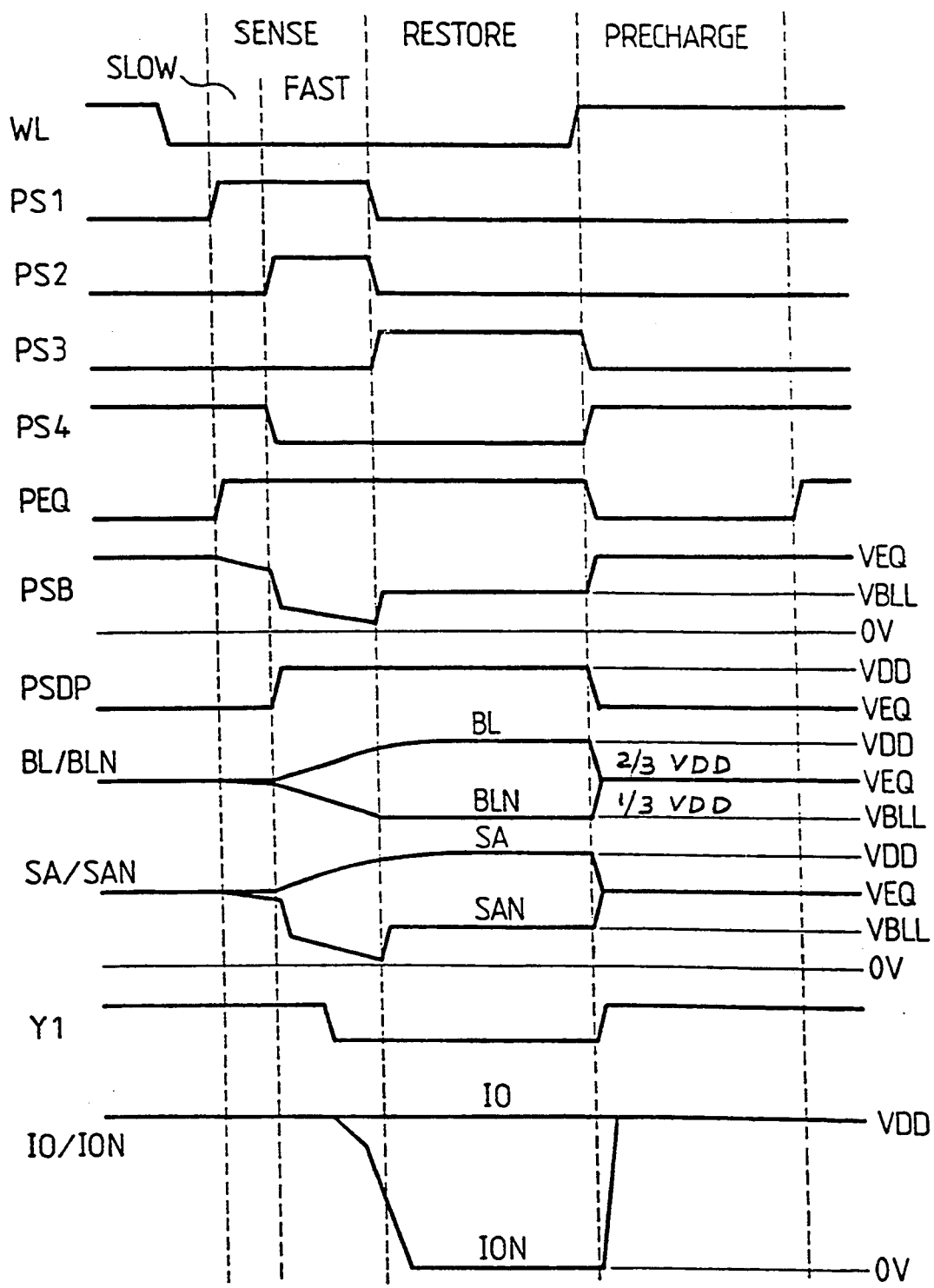
FIG. 3 is a timing diagram showing operational waveforms of the sense system of FIG. 1.

As illustrated in FIGS. 2 and 3, the low speed sense activation signal PS1 goes up to a high level, TN5 lightly conducts, causing the voltage of terminal PSB to go down slowly, whereby the first latch 10 begins to amplify the potential difference between the latch nodes SA and SAN. Next, the high speed sense activation signal PS2 goes up to a high level and the second latch activation signal PS4 falls to a low level. By the signal PS2, TN6 strongly conducts, thereby accelerating the fall of the voltage of the terminal PSB to ground. Consequently, the first latch 10 (FIG. 1) pulls down a lower level bitline toward 0V. For instance, in the example shown in FIG. 3, the lower level bitline pulled down is BLN and thus the corresponding latch node SAN is pulled down. Since at this time the equalization signal PEQ is at a high level and so FET TP7 is off, the terminal PSDP is coupled to the power supply voltage through TP6, whereby the higher level bitline and its corresponding latch node, for example, BL and SA, are pulled up from the precharge voltage VEQ to the power supply voltage VDD. The NMOS FETs TN3 and TN4 isolate the latch nodes SA and SAN from the bitline capacitances, thereby providing a high speed latching operation. Thus, the sensing operation is divided into SLOW and FAST portions as illustrated in FIG. 3.

Then, the column selection signal Y1 goes down to a low level during the sensing period, thereby coupling the sense nodes SA and SAN to the data lines IO and ION. The data lines IO and ION are precharged to VDD before the readout operation, so that the data line ION coupled to the lower level sense node SAN is discharged through the latch 10. The data line coupled to the higher level sense node SA provides the voltage of VDD to the gate of the conductive FET of the latch 10 TN2 in this example, thereby accelerating the discharge of the data line ION. The differential voltage between the data lines is further amplified by the output amplifier 18 and the voltage on the lower level data line ION goes down to 0V.

One feature of this invention lies in clamping the voltage of the lower level bitline BLN to 1/3 VDD, by means of the voltage control of the common node N1 of the first latch 10. In a first embodiment, as shown in FIG. 2, as the voltage on the lower level bitline falls toward 1/3 VDD, PS1 and PS2 turn off, turning off FETs TN5 and TN6 to leave signal PSB (and hence sense latch node N1) floating at 1/3 VDD.

However, due to fluctuations in the manufacturing process, it may become difficult to exactly set the predetermined low level restore voltage to the lower level bitline by only turning off TN5 and TN6. Accordingly, in a second embodiment of this invention, a bitline low voltage level generator 20 which generates a bitline low voltage level VBLL=1/3 VDD is coupled to the common node N1 of the latch 10. This voltage is applied to the latch node by turning off TN5 and TN6 when the lower level bitline BLN approaches 1/3 VDD, and simultaneously turning on TN7 by raising clamping signal PS3. The timing appropriate for turning off TN5 and TN6 and turning on TN7 can be determined with ease by analysis of circuit operations.

Another feature of this invention is that PMOS FETs TP1 and TP2 are used as column switches. When NMOS FETs are used as column switches, the column switch connected to the lower level sense node will have a large gate-to-source voltage VGS. Accordingly, a relatively large transient noise current will flow through the column switch when it turns on. This noise current tends to cause the voltage of the lower level sense node to rise. If the latch 10 is not adequately set, there is a possibility of causing the state of the latch 10 to be inverted, resulting in an erroneous operation. Accordingly, when NMOS FETs are used as column switches, the column switches cannot be turned on until after the latch 10 has been adequately set. In the invention, PMOS FETs are used as column switches, such that the sources of both transfer gates are at the precharge voltage VDD of the data lines. Therefore, the gate-to-source voltages of both the FETs are equal. Accordingly, the PMOS FETs work as current mirrors at the time of the turn-on transition, so that the transient noise currents through the FETs are substantially cancelled, to reduce the effect on the state of latch 10. Consequently, the column switches TP1 and TP2 can be turned on at an earlier timing before the bitline voltages reach their final levels, so that the sensed data can be transferred to the data lines earlier. It should be noted that, as seen in FIG. 3, the column selection signal Y1 is turned on earlier, near the middle of the high speed (or FAST) sensing period. Further, before the bitline voltages reach their final levels, the column switches are turned on, whereby the data line voltage VDD is coupled to the conductive side FET of the latch 10. Consequently, the drive of the latch 10 is accelerated, thus resulting in a still higher speed sensing operation.

Restoring operation

After the sensing operation, the restoring operation or rewriting is performed. When the restore operation begins, signals PS1 and PS2 are low, and signal PS3 is high. At this time, the voltage of the lower level bitline is at 1/3 VDD, while the voltage of the higher level bitline is at VDD. Accordingly, one of the binary values is restored as a voltage VBLL, and the other is restored as VDD, respectively. In the invention, the loss of signal margin resulting from storing 1/3 VDD instead of zero is compensated by utilizing high-capacitance (e.g. 80 pf) storage capacitors, such as that shown in U.S. Pat. No. 4,688,063 by Lu et al. (IBM).

Precharging Operation

During the precharging period, referring to FIG. 2, the signal PS3 goes to a low level, and PS4 to a high level, while the equalization signal PEQ goes to a low level. Accordingly, TP6 and TN7 are turned off, while TP7 is turned on. Since the terminal PSDP has been charged to a voltage of VDD and the terminal PSB has been charged to a voltage of VBLL, as TP7 turns on the voltages at the terminals PSB and PSDB are equalized to a voltage of VEQ=(VDD+VBLL)/2; thus, this voltage is given to the common nodes N1 and N2.

On the other hand, the equalizing FET TP5 is concurrently turned on to equalize the pair of bitlines, thus precharging them at a voltage of (VDD+VBLL)/2. By the combination of the equalization by the equalizing FET TP5 and the supply of the precharge voltage from the latch driving circuit 16, the pair of bitlines are rapidly precharged. VDD is 3.6V, and VBLL is about 1/3 VDD=1.2V, for example. Accordingly, the precharge voltage VEQ is about 2.4V or 2/3 VDD. Voltage levels, such as VDD, Ground (or 0V), VBLL, and VEQ are shown for several signals in FIG. 3.

According to this invention, NMOS FETs TN3 and TN4 (FIG. 1) are used as load isolation FETs, but it is also possible to use PMOS FETs which are biased by a negative voltage to a fully conductive state. However, PMOS FETs are undesirable, because it is difficult to fabricate a PMOS FET having a definite threshold value and because an extra negative voltage source becomes necessary. It is necessary that the conductances of FET TN3 and TN4 be sufficiently high to permit high speed charge transfer between the bitlines and the sensing nodes at the sensing time as well as providing high speed restore and write operations; at the same time, their conductances should be sufficiently low to provide effective isolation of the sensing nodes from the bitline capacitances.

Further, in the above-described embodiment of this invention, NMOS FETs are used for the first latch 10, and PMOS FETs for the second latch 12, but it is also possible to use PMOS FETs for the first latch 10, and NMOS FETs as the second latch 12. In this instance, however, the voltage values of the latch driving circuit 16, the conductivity types of the FETs, and the polarities of the control signals need to be reversed. In this alternative, the precharge voltage is 1/3 VDD, the bitline clamping level generator 20 generates 2/3 VDD and the upward voltage swing of the higher level bitline is clamped at 2/3 VDD. Accordingly, the voltage of the bitlines will swing between 0V and 2/3 VDD. However, it is difficult to fabricate a PMOS FET having a definite threshold value and accordingly, the data latching timing tends to be unstable. On this account, it is preferable to use NMOS FETs for the first latch 10, and PMOS FETs for the second latch.

The foregoing and other modifications may be made to the detailed description rendered above, without departing from the spirit and scope of the present invention.

We claim:

1. A semiconductor circuit comprising:
a sense amplifier circuit including a latch comprised of a pair of cross-coupled NMOS FETs having a pair of cross-coupled nodes and a common node, said common node having a variable common node voltage,
a pair of bitlines coupled to the cross-coupled nodes of said latch, said bitlines having a variable bitline voltage, said bitlines precharged to a first predetermined voltage before sensing, and
a latch driving circuit coupled to said common node of said latch, said latch driving circuit including a means for coupling a reference voltage to said common node for activation of said latch and for controlling the voltage of said common node during operation of said sense amplifier to limit downward voltage swing of the bitline voltage of one of said pair of bitlines to a second predetermined voltage that is higher than the reference voltage and lower than said first predetermined voltage.

2. A semiconductor circuit as claimed in claim 1, wherein said reference voltage is ground voltage, and said second predetermined voltage is intermediate said first predetermined voltage and said ground voltage.

3. A semiconductor circuit as claimed in claim 1, wherein said coupling means includes a first FET having a first gate, said first FET connected between said common node of said latch and said reference voltage, said first FET responsive to an activation signal applied to said gate, said signal turning on said first FET for activation of said latch, said signal turning off said first FET when said one of said pair of bitlines is at said second predetermined voltage.

4. A semiconductor circuit as claimed in claim 3, said coupling means further including:
a voltage generator which generates a bitline voltage level substantially equal to said second predetermined voltage level, and
a second FET connected between said common node of said latch and said voltage generator, said second FET being turned on when said one of said pair of bitlines falls to said second predetermined voltage level, thereby coupling said bitline voltage level to said common node.

5. A semiconductor circuit comprising:
a sense amplifier circuit including a latch comprised of a pair of cross-coupled NMOS FETs having a pair of cross-coupled nodes and a common node,
a pair of bitlines coupled to the cross-coupled nodes of said latch and precharged to a first predetermined voltage before sensing, and
a latch driving circuit coupled to said common node of said latch, said latch driving circuit including a means for coupling a reference voltage to said common node for activation of said latch, a second means for coupling a second predetermined voltage level, which is substantially equal to a restore voltage level for one of said pair of bitlines at a low voltage level, to said common node during a restore period to clamp one of said pair of bitlines to said restore voltage level, said restore voltage level being higher than said reference voltage and lower than said first predetermined voltage level, and
a third means for coupling a precharge voltage to said common node during a precharge period, said precharge voltage being higher than said second predetermined voltage level.

6. A semiconductor circuit as claimed in claim 5, wherein said restore voltage level has a value intermediate between said precharge voltage and said reference voltage.

7. A semiconductor circuit as claimed in claim 6, wherein:
said first means includes a first FET having a first gate, said first FET connected between said common node of said latch and said reference voltage, said first FET responsive to a first activation signal applied to said first gate, said first activation signal turning on said first FET to activate said latch, said first activation signal turning off said first FET when said one of said pair of bitlines falls to said restore voltage level,
said second means includes a second FET having a second gate, said second FET connected between said common node of said latch and a bitline low voltage generator, said second FET responsive to a second activation signal applied to said second gate, said second activation signal turning on said second FET when said one of said pair of bitlines falls to said restore voltage level upon initiation of said restore period, said second activation signal turning off said second FET at the end of said restore period, and said third means includes a third FET having a third gate, said third FET responsive to a third activation signal applied to said third gate, said third activation signal turning on said third FET during said precharging period, thereby charging said common node of said latch to a power supply voltage.

8. A semiconductor circuit comprising:
a first latch comprised of cross-coupled NMOS FETs and having a first pair of cross-coupled nodes and a common node,
a second latch comprised of cross-coupled PMOS FETs having a second pair of cross-coupled nodes and a common node,
isolation FETs connected, respectively, between said cross-coupled nodes of said first and second latches,
a pair of bitlines coupled to said cross-coupled nodes of said second latch and precharged to a first predetermined voltage level before sensing,
a pair of data lines,
gate FETs coupling said cross-coupled nodes of said first latch to said data lines, and
a latch driving circuit having a first terminal coupled to said common node of said first latch and a second terminal coupled to said common node of said second latch,
said latch driving circuit comprising:
a first means for coupling a reference voltage to said first terminal for activation of said first latch,
a second means for coupling a second predetermined voltage level that is higher than said reference voltage to said first terminal when the voltage of one of said pair of bitlines falls to said second predetermined voltage level, and
a third means for coupling a first power supply voltage to said second terminal for activation of said second latch during the sensing period.

9. A semiconductor circuit as claimed in claim 8, wherein said isolation FETs are NMOS FETs responsive to said first power supply voltage.

10. A semiconductor circuit as claimed in claim 8, wherein one of said pairs of bitlines is restored to said second predetermined voltage level and the other of said bitlines is restored to said first power supply voltage.

11. A semiconductor circuit as claimed in claim 10, wherein said second predetermined voltage level has a value intermediate between said first determined voltage level and said reference voltage.

12. A semiconductor circuit as claimed in claim 8, wherein said first predetermined voltage level is intermediate said second predetermined voltage level and said power supply voltage.

13. A semiconductor circuit comprising:
a sense amplifier circuit including a first latch comprised of cross-coupled FETs of a first conductivity type and having a first pair of cross-coupled nodes and a common node, and a second latch comprised of cross-coupled FETs of a second conductivity type and having a second pair of cross-coupled nodes and a common node, said cross-coupled nodes of said first latch being coupled with said cross-coupled nodes of said second latch,
a pair of bitlines coupled to said cross-coupled nodes of said second latch and precharged to a predetermined voltage before sensing, and
a latch driving circuit having a first terminal connected to said common node of said first latch and a second terminal connected to said common node of said second latch,
said latch driving circuit being comprised of;
a first means for coupling a first voltage to said first terminal for activation of said first latch,
a second means for coupling a bitline voltage clamping level to said first terminal when one of said pair of bitlines that is pulled toward said first voltage by the activation of said first latch reaches a predetermined voltage level which is between said precharge voltage and said first voltage and substantially equal to said bitline voltage clamping level, and
a third means for coupling a second voltage to said second terminal for activation of said second latch during activation of said first latch.

14. A semiconductor circuit as claimed in claim 13, wherein said bitline voltage clamping level provides a first restore voltage, and said second voltage provides a second restore voltage.

15. A semiconductor circuit as claimed in claim 14, wherein said bitline voltage clamping level has a value intermediate between said precharge voltage and said first voltage.

16. A semiconductor circuit as claimed in claim 13, wherein said latch driving circuit includes a source of precharge voltage which is intermediate between said bitline voltage clamping level and said second voltage and a fourth means to couple said precharge voltage to said first terminal when said first latch becomes inactive.

17. A semiconductor circuit as claimed in claim 16, wherein said first means includes a first FET connected between said first terminal and said first voltage and being responsive to a first latch activation signal,
said second means includes a second FET connected between said first terminal and a bitline voltage clamping level generator, and being responsive to a bitline voltage clamping signal,
said third means includes a third FET connected between said second voltage and said second terminal and being responsive to a second latch activation signal, and
said fourth means includes a fourth FET connected between said first and second terminals and being responsive to an equalization signal.

* * * * *